(12) United States Patent
Shimizu et al.

(10) Patent No.: US 12,312,674 B2
(45) Date of Patent: May 27, 2025

(54) SPUTTERING TARGET

(71) Applicant: JX Advanced Metals Corporation, Tokyo (JP)

(72) Inventors: Masayoshi Shimizu, Ibaraki (JP); Yasuyuki Iwabuchi, Ibaraki (JP); Manami Masuda, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 0 days.

(21) Appl. No.: 17/951,234

(22) Filed: Sep. 23, 2022

(65) Prior Publication Data

US 2023/0019656 A1    Jan. 19, 2023

Related U.S. Application Data

(62) Division of application No. 16/468,769, filed as application No. PCT/JP2018/030435 on Aug. 16, 2018.

(30) Foreign Application Priority Data

Sep. 21, 2017  (JP) ................. 2017-180829

(51) Int. Cl.
  *C23C 14/16* (2006.01)
  *C23C 14/08* (2006.01)
  (Continued)

(52) U.S. Cl.
  CPC .......... *C23C 14/165* (2013.01); *C23C 14/083* (2013.01); *C23C 14/3407* (2013.01);
  (Continued)

(58) Field of Classification Search
  CPC . C23C 14/165; C23C 14/083; C23C 14/3407; G11B 5/70621; G11B 5/7353;
  (Continued)

(56) References Cited

U.S. PATENT DOCUMENTS

2006/0121319 A1   6/2006   Wu et al.
2006/0139799 A1   6/2006   Wu et al.
(Continued)

FOREIGN PATENT DOCUMENTS

JP   2001-026860 A    1/2001
JP   2005251375 A  *  9/2005
(Continued)

OTHER PUBLICATIONS

Wikipedia, Solid Solution, 2006 (Year: 2006).*
(Continued)

*Primary Examiner* — James Lin
*Assistant Examiner* — Patrick S Ott
(74) *Attorney, Agent, or Firm* — Marshall, Gerstein & Borun LLP

(57) ABSTRACT

A sputtering target according to the present invention contains Co and Pt as metal components, wherein a molar ratio of a content of Pt to a content of Co is from 5/100 to 45/100, and wherein the sputtering target contains $Nb_2O_5$ as a metal oxide component.

8 Claims, 6 Drawing Sheets

(51) Int. Cl.
  *C23C 14/34* (2006.01)
  *G11B 5/65* (2006.01)
  *G11B 5/706* (2006.01)
  *G11B 5/735* (2006.01)
  *G11B 5/851* (2006.01)
  *H01F 41/18* (2006.01)
  *G11B 5/73* (2006.01)

(52) U.S. Cl.
  CPC .......... *G11B 5/658* (2021.05); *G11B 5/70621* (2013.01); *G11B 5/7353* (2019.05); *G11B 5/851* (2013.01); *H01F 41/18* (2013.01); *G11B 5/73919* (2019.05); *G11B 5/73921* (2019.05)

(58) Field of Classification Search
  CPC . G11B 5/851; G11B 5/73919; G11B 5/73921; H01F 41/18
  See application file for complete search history.

(56) References Cited

U.S. PATENT DOCUMENTS

| | | | |
|---|---|---|---|
| 2006/0233658 A1 | 10/2006 | Ziani | |
| 2009/0120237 A1 | 5/2009 | Ziani | |
| 2009/0257144 A1* | 10/2009 | Tamai | G11B 5/65 428/828.1 |
| 2010/0188772 A1 | 7/2010 | Sasaki et al. | |
| 2011/0284373 A1 | 11/2011 | Sato et al. | |
| 2012/0024192 A1* | 2/2012 | Takami | C04B 35/499 204/192.15 |
| 2012/0114975 A1 | 5/2012 | Liu et al. | |
| 2013/0206592 A1* | 8/2013 | Arakawa | C23C 14/3414 204/298.13 |
| 2013/0206593 A1 | 8/2013 | Arakawa et al. | |
| 2013/0213802 A1* | 8/2013 | Sato | C23C 14/3407 264/681 |
| 2014/0367254 A1* | 12/2014 | Sato | C23C 14/3414 204/298.13 |
| 2015/0211109 A1 | 7/2015 | Goto et al. | |
| 2017/0194131 A1* | 7/2017 | Tham | C22C 1/05 |
| 2018/0022607 A1* | 1/2018 | Matsuno | C01B 13/11 422/186.07 |
| 2018/0355473 A1 | 12/2018 | Tham et al. | |

FOREIGN PATENT DOCUMENTS

| | | |
|---|---|---|
| JP | 2006-299401 A | 11/2006 |
| JP | 2010-176727 A | 8/2010 |
| JP | 5960287 B2 | 8/2016 |
| TW | 201435122 A | 9/2014 |
| WO | WO-2011/016365 A1 | 2/2011 |
| WO | WO-2014/178310 A1 | 11/2014 |

OTHER PUBLICATIONS

JP-2005251375-A Translation (Year: 2005).*
International Search Report in International Application No. PCT/JP2018/030435 dated Nov. 13, 2018, 5 pages.
Office Action in TW Application No. 107127244 dated Mar. 22, 2019, 6 pages.
Office Action in TW Application No. 107127244 dated Jun. 19, 2019, 7 pages.
International Preliminary Report on Patentability and Written Opinion in International Application No. PCT/JP2018/030435 dated Apr. 2, 2020.

* cited by examiner

[FIG. 1]
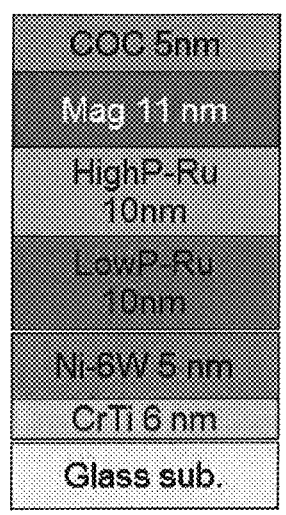

[FIG. 2]
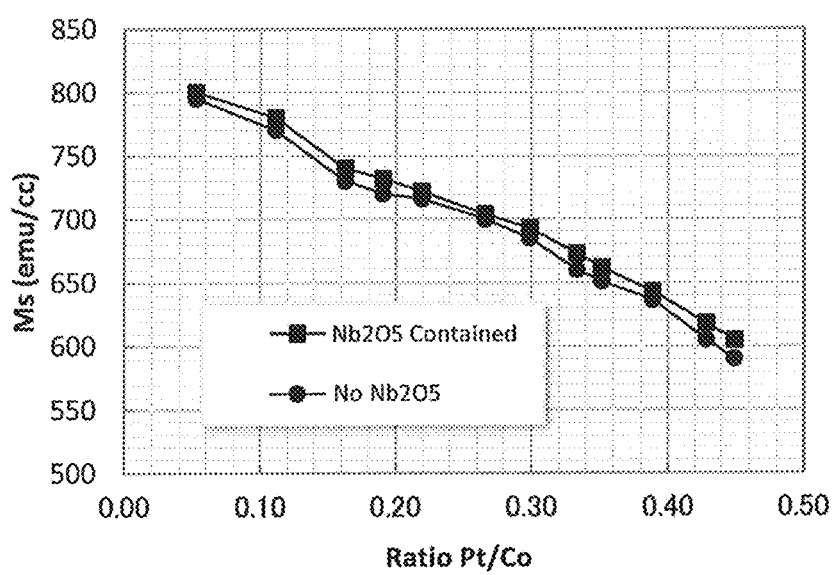

[FIG. 3]
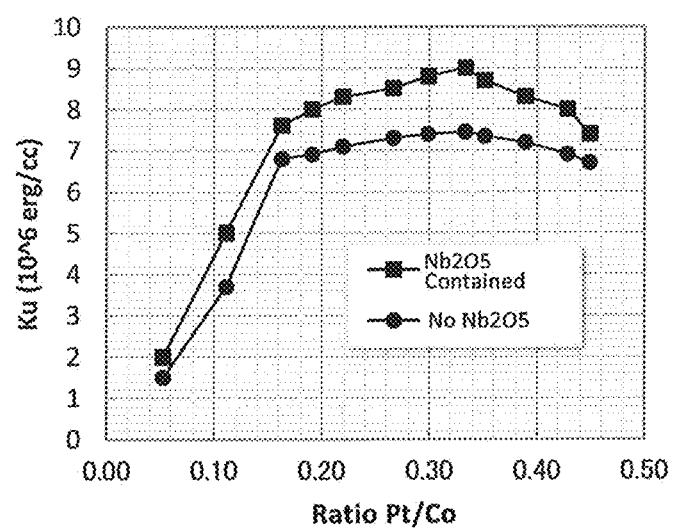

[FIG. 4]
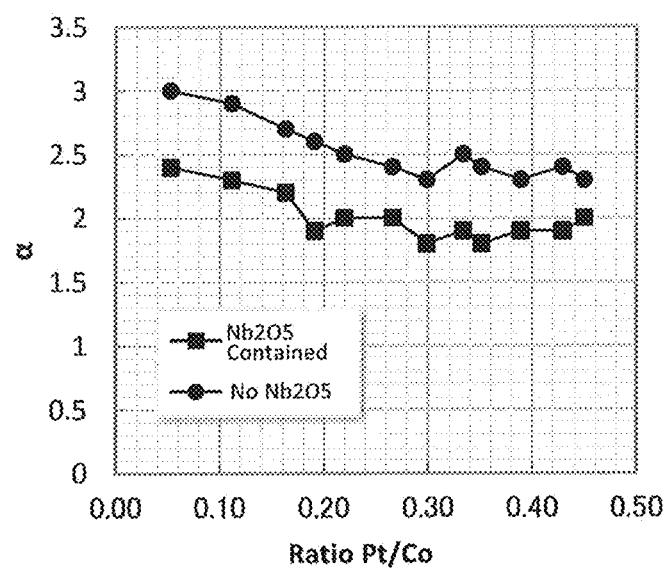

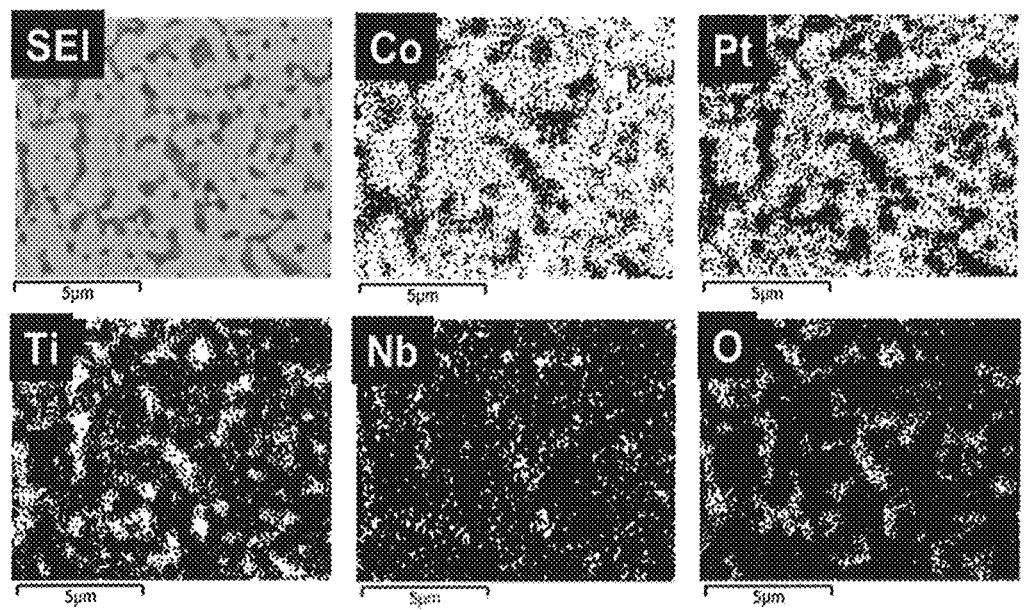
[FIG. 5]

[FIG. 6]
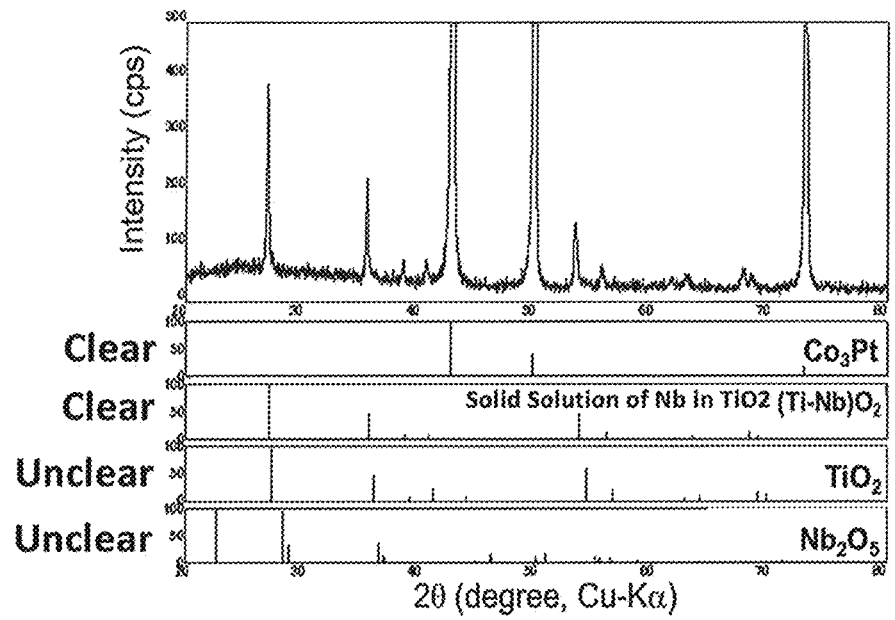
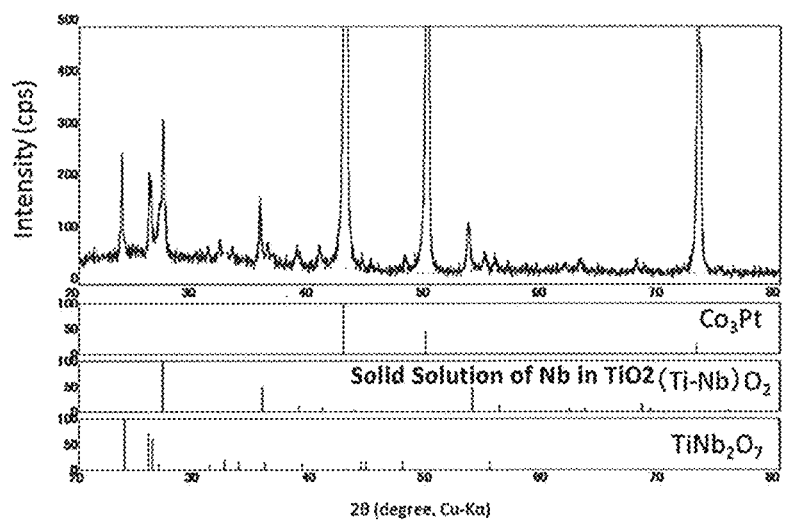

SPUTTERING TARGET

CROSS-REFERENCE TO RELATED APPLICATIONS

This application is a divisional of U.S. application Ser. No. 16/468,769 filed Jun. 12, 2019, which is the U.S. national stage of PCT/JP2018/030435 filed Aug. 16, 2018, which claims the priority benefit of JP application No. 2017-180829, filed on Sep. 21, 2017, the respective disclosures of each of which are hereby incorporated by reference in their entirety for all purposes herein.

TECHNICAL FIELD

The present invention relates to a sputtering target which contains Co and Pt as metal components and is suitable for use in forming a magnetic layer onto an intermediate layer or the like of a perpendicular magnetic recording medium, for example; to a method for producing a laminated film; and to a magnetic recording medium. More particularly, the present invention proposes a technique capable of contributing to production of a hard disk drive having high density.

BACKGROUND ART

In a hard disk drive, a perpendicular magnetic recording system for recording magnetism in a direction perpendicular to a recording surface has been put to practical use. This method is widely adopted because it enables high-density recording as compared with an in-plane magnetic recording method.

The magnetic recording medium in the perpendicular magnetic recording method generally has a structure in which a base layer such as an adhesion layer, a soft magnetic layer, a seed layer and a Ru layer, an intermediate layer, a magnetic layer, and a protective layer, and the like are sequentially laminated on a substrate such as aluminum or glass. Among them, in a lower part of the magnetic layer is a granular film in which $SiO_2$ or other metal oxide is dispersed in a Co—Pt based alloy containing Co as a main component, and the granular layer has high saturation magnetization Ms and magnetic anisotropy Ku. Further, the intermediate layer laminated on a lower side of the magnetic layer includes a structure having a Co—Cr—Ru based alloy or the like dispersing the similar metal oxide therein. The intermediate layer may contain a relatively large amount of Ru, Cr or the like in order to render the intermediate layer nonmagnetic.

In such a magnetic layer and an intermediate layer, the above metal oxide that will be a nonmagnetic material is precipitated at grain boundaries of magnetic particles such as a Co alloy or the like oriented in the vertical direction to reduce magnetic interaction, thereby improving noise characteristics and achieving high recording density.

In general, each layer such as the magnetic layer and the intermediate layer is formed by sputtering a material onto a substrate using a sputtering target having a predetermined composition or structure to form a film. Conventionally, such a type of technology is disclosed in Patent Document 1 and the like.

CITATION LIST

Patent Literature

Patent Document 1: Japanese Patent No. 5960287 B

SUMMARY OF INVENTION

Technical Problem

To realize high density of the hard disk drive, there are needs for an increase in the magnetic anisotropy Ku for ensuring thermal stability and high magnetic separation of the magnetic particles for high resolution.

However, the magnetic layer having high saturation magnetization Ms as described above has a strong exchange coupling between the magnetic particles, so that the magnetic layer has poor magnetic separation of the magnetic particles. Here, if a large amount of a metal oxide is added in order to improve the magnetic separation, the metal oxide will enter the magnetic particles to deteriorate crystallinity of the magnetic particles, whereby the saturation magnetization Ms and the magnetic anisotropy Ku are decreased accordingly.

An object of this invention is to solve such problems of the prior art. An object of this invention is to provide a sputtering target, a method for producing a laminated film, a laminated film and a magnetic recording medium, which can improve magnetic separation between the magnetic particles, without significantly lowering magnetic anisotropy of a magnetic layer in a magnetic recording medium.

Solution to Problem

As a result of intensive studies, the inventors have found that when $Nb_2O_5$ is used as a metal oxide for a nonmagnetic material to be dispersed in a Co alloy which is a magnetic material for a magnetic layer and an intermediate layer, in addition to or in place of $SiO_2$ conventionally used, the magnetic separation between the magnetic particles can be significantly improved even if the content of the metal oxide is not increased so much. Further, the present inventors have found that this can allow high saturation magnetization Ms and high magnetic anisotropy Ku of the magnetic layer mainly based on Co—Pt to be maintained. Furthermore, the present inventors have found that containing both $Nb_2O_5$ and $TiO_2$ provides further higher Ms and Ku while maintaining magnetic separation.

It is believed that this is because $Nb_2O_5$ has reasonable wettability to Co and can form a stable oxide even if a part of oxygen is lacked so that a grain boundary having a uniform width can be formed around the magnetic grains without penetrating the oxide in the magnetic grains, although the present invention is limited to such a theory.

Based on such findings, a sputtering target according to the present invention contains Co and Pt as metal components, wherein a molar ratio of a content of Pt to a content of Co is from 5/100 to 45/100, and wherein the sputtering target contains $Nb_2O_5$ as a metal oxide component.

Preferably, the sputtering target according to the present invention further contains $TiO_2$ as a metal oxide component.

It is preferable that the sputtering target according to the present invention has a content of $Nb_2O_5$ of from 0.5 mol % to 5 mol %. When $TiO_2$ is contained, the content of $TiO_2$ is preferably from 0.5 mol % to 15 mol %.

Further, it is preferable that the sputtering target according to the present invention has a phase including all of Ti, Nb and O.

It is preferable that the sputtering target according to the present invention further contains at least one metal oxide of $SiO_2$ and $B_2O_3$ as a metal oxide component, and wherein the sputtering target has a total content of metal oxides including $Nb_2O_5$ of from 20 vol % to 40 vol %.

Preferably, the sputtering target according to the present invention has a molar ratio of a content of Pt to a content of Co of from 15/100 to 35/100.

Preferably, the sputtering target according to the present invention contains Pt in an amount of from 2 mol % to 25 mol %.

In addition, the sputtering target according to the present invention may further contain Cr and/or Ru as a metal component(s) in an amount of from 0.5 mol % to 20 mol %.

A method for producing a laminated film according to the present invention comprises forming, by sputtering using any one of the sputtering targets described above, a magnetic layer on a base layer containing Ru or on an intermediate layer formed on the base layer by sputtering using a sputtering target containing Co and at least one metal selected from the group consisting of Cr and Ru as a metal component.

A laminated film according to the present invention comprises: a base layer containing Ru; and a magnetic layer directly formed on the base layer or indirectly formed on the base layer via an intermediate layer containing Co and at least one metal selected from the group consisting of Cr and Ru as a metal component, the magnetic layer containing Co and Pt as metal components and having a molar ratio of a content of Pt to a content of Co of from 5/100 to 45/100; wherein the magnetic layer contains $Nb_2O_5$, preferably $TiO_2$ in addition to $Nb_2O_5$, as a metal oxide component(s).

A magnetic recording medium according to the present invention comprises the laminated film as described above.

Advantageous Effects of Invention

According to the present invention, at least $Nb_2O_5$, preferably $Nb_2O_5$ together with $TiO_2$ is/are contained as a metal oxide component(s), so that it is possible to achieve both good magnetic separation between magnetic particles and high magnetic anisotropy Ku.

BRIEF DESCRIPTION OF DRAWINGS

FIG. 1 is a schematic view showing a layer structure of a laminated film produced in Examples.

FIG. 2 is a graph showing a change of saturation magnetization Ms relative to a ratio Pt/Co in Examples.

FIG. 3 is a graph showing a change of magnetic anisotropy Ku relative to a ratio Pt/Co in Examples.

FIG. 4 is a graph showing a change of a slope α of a magnetization curve relative to a ratio Pt/Co in Examples.

FIG. 5 is SEM/EDS mapping images of targets in Examples.

FIG. 6 is a graph showing a result of identification of a crystal structure using XRD of a target in Examples.

DESCRIPTION OF THE PREFERRED EMBODIMENTS

Embodiments of the present invention will be described in detail below.

In an embodiment, a sputtering target according to the present invention contains Co and Pt as metal components, and has a molar ratio of a content of Pt to a content of Co of from 5/100 to 45/100, and contains $Nb_2O_5$ or $Nb_2O_5$ and $SiO_2$ as a metal oxide component(s).

More particularly, the sputtering target has a structure in which metal oxides containing $Nb_2O_5$ are dispersed in an alloy made of Co and Pt. When both $TiO_2$ and $Nb_2O_5$ are contained, the sputtering target has a structure in which a solid solution of $TiO_2$ and $Nb_2O_5$ is dispersed as metal oxides.

The sputtering target is preferably used for forming a magnetic layer, in particular located onto an intermediate layer in a perpendicular magnetic recording type magnetic recording medium. In this case, in the magnetic layer formed by sputtering using the sputtering target, the above metal components form magnetic grains and the metal oxides containing $Nb_2O_5$ form nonmagnetic materials which are uniformly distributed around the magnetic grains oriented in the vertical direction, so that the magnetic interaction between the magnetic grains is effectively reduced.

(Composition)

The metal component of the sputtering target is mainly composed of Co, and, in addition, contains Pt. In particular, the metal component is a Co alloy containing Pt.

The content of Pt is preferably from 2 mol % to 25 mol %. If the total content of Pt is too high, magnetic anisotropy may be decreased or crystallinity of the magnetic grains may be decreased. On the other hand, if the ratio of the total content of Pt to Co is too low, the magnetic anisotropy may be insufficient.

Pt is contained in an amount such that a molar ratio to a content of Co is from 5/100 to 45/100, because if the molar ratio of the Pt content to the Co content is less than 5/100 or more than 45/100, the magnetic anisotropy is lowered. From the viewpoint, the molar ratio of the Pt content to the Co content is more preferably from 15/100 to 35/100. In addition, if the content of Co is too high, the magnetic anisotropy may be lowered. On the other hand, if the content of Co is too low, the saturation magnetization and the magnetic anisotropy may be decreased.

The sputtering target according to the embodiment of the present invention may further contain Cr and/or Ru in an amount of from 0.5 mol % to 20 mol % as a metal component(s). The containing of such a metal(s) provides an advantage that the saturation magnetization and the magnetic anisotropy can be adjusted while maintaining the crystallinity of the magnetic grains. In addition, many of these metals are usually contained as metal components, but some of them may be included as metal oxides by being oxidized by sintering in the production, which will be described below.

The sputtering target according to the present invention contains at least $Nb_2O_5$ as a metal oxide component. $Nb_2O_5$ has better wettability to Co as compared with $SiO_2$ or the like which is the main metal oxide in the conventional sputtering target, and forms a stable oxide even if a part of oxide is lacked. Therefore, by containing $Nb_2O_5$, the separation of magnetic grains can be improved while maintaining the magnetic anisotropy. Further, by containing both $Nb_2O_5$ and $TiO_2$, higher Ms and Ku can be obtained while maintaining the magnetic separation.

The content of $Nb_2O_5$ is preferably from 0.5 mol % to 5 mol %. If the content of $Nb_2O_5$ is lower, there is a possibility that the above effect cannot be sufficiently obtained. On the other hand, if the content of $Nb_2O_5$ is higher, the magnetic anisotropy may be decreased. Therefore, it is even more preferable that the content of $Nb_2O_5$ is from 0.5 mol % to 3 mol %.

When $TiO_2$ is contained, the content of $TiO_2$ is preferably from 0.5 mol % to 15 mol %. If the content of $TiO_2$ is lower, there is a possibility that the above effect cannot be sufficiently obtained. On the other hand, if the content of $TiO_2$ is higher, an oxide volume may be increased and the magnetic anisotropy may be decreased.

Further, the sputtering target more preferably has a phase containing all of Ti, Nb and O. Examples of such a phase includes a solid solution phase in which Nb is mixed with $TiO_2$, or a solid solution phase in which Ti is mixed with $Nb_2O_5$, and a complex oxide phase such as $TiNb_2O_7$ and $TiNb_6O_{17}$. In this case, a part of oxygen may be lacked. The phases in which Ti, Nb and O are mixed can be confirmed by intensity signals of Nb, Ti and O from the same position by element mapping using SEM/EDS, for example. Further, the solid solution phase and the complex oxide phase can be confirmed by XRD evaluation using X rays.

Further, the sputtering target according to the embodiment of the present invention may contain metal oxides such as $SiO_2$ and $B_2O_3$ in addition to $Nb_2O_5$ and $TiO_2$ as metal oxide components.

When containing the above metal oxides other than $Nb_2O_5$, the total content of all of the metal oxides including $Nb_2O_5$ is preferably from 20 vol % to 40 vol %. If the total content of the metal oxides is less than 20 vol %, the separation of the magnetic grains may become insufficient. On the other hand, if it is more than 40 vol %, the saturation magnetization may be decreased. For these reasons, it is more preferable that the total content of metal oxides is from 25 vol % to 35 vol %.

(Method for Producing Sputtering Target)

The above sputtering target can be produced by a powder sintering method, and specific examples thereof are as follows.

First, as metal powder, Co powder and Pt powder, and optionally further powder of the other metals as described above, are prepared. The metal powder may be powder of not only a single element but also an alloy. The particle diameter of the metal power is preferably in a range of from 1 μm to 10 μm, in terms of enabling homogeneous mixing to prevent segregation and coarse crystallization. When the particle size of the metal powder is more than 10 μm, oxide particles as described below may not be uniformly dispersed, and when it is less than 1 μm, the sputtering target may deviate from the desired composition due to the oxidation of the metal powder.

Further, as the oxide powder, at least $Nb_2O_5$ powder and optionally at least one powder selected from the group consisting of $TiO_2$ powder, $SiO_2$ powder and $B_2O_3$ powder are prepared. The oxide powder has a particle diameter in a range of from 1 μm to 30 μm. This can lead to more uniform dispersion of the oxide particles in the metal phase when the oxide powder is mixed with the metal powder, and fired under pressure. If the particle diameter of the oxide powder is more than 30 μm, coarse oxide particles may be formed after firing under pressure. On the other hand, if it is less than 1 μm, agglomeration of the oxide powders may occur.

The above metal powder and oxide powder are weighed so as to provide a desired composition, and mixed and pulverized using a known way such as a ball mill. In this case, it is desirable to fill the inside of a container used for the mixing/pulverizing with an inert gas to suppress the oxidation of the raw material powder as much as possible. This can provide mixed powder in which predetermined metal powder and oxide powder are uniformly mixed.

The mixed powder thus obtained is then sintered under pressure in a vacuum atmosphere or an inert gas atmosphere, and formed into a predetermined shape such as a disk shape. Herein, various pressure sintering methods can be employed such as a hot press sintering method, a hot hydrostatic sintering method, a plasma discharge sintering method and the like. Among them, the hot hydrostatic sintering method is effective in terms of improvement of density of a sintered body.

A retention temperature during the sintering is in a temperature range of from 700 to 1500° C., and particularly preferably from 800° C. to 1400° C. A time for maintaining the temperature in this range is preferably 1 hour or more.

A pressing pressure during the sintering is preferably from 10 MPa to 40 MPa, and more preferably from 25 MPa to 35 MPa.

This can allow the oxide particles to be more uniformly dispersed in the metal phase.

The sintered body obtained by the pressure sintering can be subjected to cutting into a desired shape using a lathe or the like or other mechanical processing to produce a sputtering target.

(Laminated Film)

The laminated film includes, at least, a base layer; and a magnetic layer formed on the base layer.

More particularly, the base layer contains Ru, and generally, it is composed of Ru, or it is a layer mainly based on Ru.

An intermediate layer can be provided between the base layer and the magnetic layer. The intermediate layer contains, as metal components, Co and at least one metal selected from the group consisting of Cr and Ru, has a molar ratio of the content of at least one metal selected from the group consisting of Cr and Ru to the content of Co of ½ or more. Further, the intermediate layer preferably contains at least one selected from the group consisting of $Nb_2O_5$, $TiO_2$, $SiO_2$, $B_2O_3$, CoO, $Co_3O_4$, $Cr_2O_3$, $Ta_2O_5$, ZnO and MnO as a metal oxide component. Among them, $Nb_2O_5$ is preferably contained.

Further, the content of $Nb_2O_5$ in the intermediate layer may be from 5 mol % to 15 mol %, or when the intermediate layer contains other metal oxides, the content of $Nb_2O_5$ may be from 2 mol % to 5 mol %. The intermediate layer may further contain the above metal oxides other than $Nb_2O_5$ and may have a total content of metal oxides including $Nb_2O_5$ of 30 vol % or more.

The Co content in the intermediate layer may be from 15 mol % to 60 mol %, and the total content of Cr and Ru may be from 30 mol % to 60 mol %. In addition, the intermediate layer may further contain Pt in an amount of from 2 mol % to 25 mol % as a metal component.

Preferably, the magnetic layer contains Co and Pt as metal components, has a molar ratio of a content of Pt to a content of Co of from 5/100 to 45/100, and preferably from 15/100 to 35/100, and contains $Nb_2O_5$ as a metal oxide component. The containing of $Nb_2O_5$ in the magnetic layer can lead to improved magnetic separation of the magnetic grains. Further, the containing of both $Nb_2O_5$ and $TiO_2$ can increase Ms and Ku while maintaining magnetic separation.

The magnetic layer can be formed on the intermediate layer by sputtering using the above sputtering target.

Therefore, as with the sputtering target as described above, it is preferable that the magnetic layer has a content of $Nb_2O_5$ of from 0.5 mol % to 5 mol %, and when $TiO_2$ is contained, it has a content of $TiO_2$ of from 0.5 mol % to 15 mol %, and when the magnetic layer further contains at least one metal oxide selected from the group consisting of $SiO_2$ and $B_2O_3$ as a metal oxide components, it has the total content of metal oxides including $Nb_2O_5$ of from 20 vol % to 40 mol %, and the magnetic layer contains Pt in an amount of from 2 mol % to 25 mol %, and the magnetic layer further contains Cr and/or Ru in an amount of from 0.5 mol % to 20 mol % as a metal component(s).

(Method for Producing Laminated Film)

Each layer in the laminated film can be produced by forming each film with a magnetron sputtering apparatus or the like using a sputtering target having a composition and a structure corresponding to each layer thereof.

Here, the intermediate layer in the laminated film is formed on the base layer by sputtering using a sputtering target containing Co and at least one metal selected from the group consisting of Cr and Ru.

The magnetic layer in the laminated film can be formed on the intermediate layer by sputtering using the sputtering target as described above.

(Magnetic Recording Medium)

The magnetic recording medium is provided with the laminated film including the base layer, the intermediate layer formed on the base layer, and the magnetic layer formed on the intermediate layer as described above. The magnetic recording medium is usually produced by sequentially forming a soft magnetic layer, a base layer, an intermediate layer, a magnetic layer, a protective layer, and the like on a substrate made of aluminum, glass or the like.

EXAMPLES

Next, the sputtering target according to present invention was experimentally conducted and effects exerted by a magnetic layer formed by the sputtering target were confirmed as described below. However, the description herein is merely for the purpose of illustration and is not intended to be limited thereto.

Using various sputtering targets, each laminated film having the layer structure shown in FIG. 1 was produced.

Here, the magnetic layers shown as "Mag" in FIG. 1 were formed from the sputtering targets having different compositions as shown in Table 1. Saturation magnetization Ms, magnetic anisotropy Ku, and a slope α of a magnetization curve for a coercive force of each laminated film having each of the magnetic layers were measured, respectively.

Here, the saturation magnetization Ms and the slope α of the magnetization curve were measured with a vibrated sample type magnetometer (VSM) available from TAMAGAWA CO., LTD., and the magnetic anisotropy Ku was measured by a magnetic torque meter (TRQ) available from TAMAGAWA CO., LTD. A volume fraction of the oxide was determined by calculating a volume of the entire target and a volume of the oxide based on the density and weight of the raw material powder, and obtaining a ratio of them.

In Table 1, "x" in the "Effect" section means that there was no reduction effect of α, "O" means that there was a reduction effect of α, and "⊚" means that there was a remarkable reduction effect of α, respectively.

TABLE 1

| | Target Composition | Pt/Co Ratio | Co Contained Molar Ratio | Pt Contained Molar Ratio | Oxide Volume Fraction | Ms | Ku | α | Effect |
|---|---|---|---|---|---|---|---|---|---|
| Example 1 | (Co—5Pt)—1.5Nb2O5—5TiO2—4SiO2 | 0.05 | 85.0 | 4.5 | 31.0 | 800 | 2 | 2.4 | O |
| Example 2 | (Co—10Pt)—1.5Nb2O5—5TiO2—4SiO2 | 0.11 | 80.6 | 9.0 | 31.0 | 780 | 5 | 2.3 | O |
| Example 3 | (Co—14Pt)—1.5Nb2O5—5TiO2—4SiO2 | 0.16 | 77.0 | 12.5 | 31.0 | 740 | 7.6 | 2.2 | O |
| Example 4 | (Co—16Pt)—1.5Nb2O5—5TiO2—4SiO2 | 0.19 | 75.2 | 14.3 | 31.0 | 732 | 8 | 1.9 | ⊚ |
| Example 5 | (Co—18Pt)—1.5Nb2O5—5TiO2—4SiO2 | 0.22 | 73.4 | 16.1 | 31.0 | 722 | 8.3 | 2 | ⊚ |
| Example 6 | (Co—21Pt)—1.5Nb2O5—5TiO2—4SiO2 | 0.27 | 70.7 | 18.8 | 31.0 | 704 | 8.5 | 2 | ⊚ |
| Example 7 | (Co—23Pt)—1.5Nb2O5—5TiO2—4SiO2 | 0.30 | 68.9 | 20.6 | 31.0 | 693 | 8.8 | 1.8 | ⊚ |
| Example 8 | (Co—25Pt)—1.5Nb2O5—5TiO2—4SiO2 | 0.33 | 67.1 | 22.4 | 31.0 | 673 | 9 | 1.9 | ⊚ |
| Example 9 | (Co—26Pt)—1.5Nb2O5—5TiO2—4SiO2 | 0.35 | 66.2 | 23.3 | 31.0 | 662 | 8.7 | 1.8 | ⊚ |
| Example 10 | (Co—28Pt)—1.5Nb2O5—5TiO2—4SiO2 | 0.39 | 64.4 | 25.1 | 31.0 | 643 | 8.3 | 1.9 | ⊚ |
| Example 11 | (Co—30Pt)—1.5Nb2O5—5TiO2—4SiO2 | 0.43 | 62.7 | 26.9 | 31.0 | 618 | 8 | 1.9 | ⊚ |
| Example 12 | (Co—31Pt)—1.5Nb2O5—5TiO2—4SiO2 | 0.45 | 61.8 | 27.7 | 31.0 | 605 | 7.4 | 2 | O |
| Example 13 | (Co—25Pt)—0.3Nb2O5—6.5TiO2—4.5SiO2 | 0.33 | 66.5 | 22.2 | 29.0 | 640 | 7.8 | 2.1 | O |
| Example 14 | (Co—25Pt)—0.5Nb2O5—5TiO2—6SiO2 | 0.33 | 66.4 | 22.1 | 30.9 | 681 | 9.2 | 2 | ⊚ |
| Example 15 | (Co—25Pt)—1Nb2O5—6.5TiO2—4SiO2 | 0.33 | 66.4 | 22.1 | 31.1 | 680 | 9 | 1.9 | ⊚ |
| Example 16 | (Co—25Pt)—3Nb2O5—3TiO2—2SiO2 | 0.33 | 69.0 | 23.0 | 29.9 | 670 | 8.5 | 1.7 | ⊚ |
| Example 17 | (Co—25Pt)—5Nb2O5 | 0.33 | 71.3 | 23.8 | 29.6 | 580 | 7.2 | 1.7 | O |
| Example 18 | (Co—25Pt)—3Nb2O5—7.5TiO2 | 0.33 | 67.1 | 22.4 | 30.9 | 680 | 9.1 | 1.6 | ⊚ |
| Example 19 | (Co—25Pt)—1.5Nb2O5—10TiO2 | 0.33 | 66.4 | 22.1 | 30.0 | 670 | 8.8 | 1.6 | ⊚ |
| Example 20 | (Co—25Pt)—4.8Nb2O5—0.6TiO2 | 0.33 | 71.0 | 23.7 | 29.7 | 600 | 7.5 | 1.6 | ⊚ |
| Example 21 | (Co—25Pt)—0.5Nb2O5—14TiO2 | 0.33 | 64.1 | 21.4 | 32.0 | 590 | 7.4 | 1.5 | ⊚ |
| Example 22 | (Co—25Pt)—3Nb2O5—4SiO2 | 0.33 | 69.8 | 23.3 | 29.6 | 740 | 9.1 | 2.3 | O |
| Example 23 | (Co—25Pt)—1.5Nb2O5—7SiO2 | 0.33 | 68.6 | 22.9 | 29.6 | 750 | 9.3 | 2.4 | O |
| Example 24 | (Co—21Pt4Cr4Ru)—1.5Nb2O5—5TiO2—4SiO2 | 0.30 | 63.5 | 18.8 | 31.0 | 580 | 5.5 | 1.1 | ⊚ |
| Example 25 | (Co—21Pt4Cr)—1.5Nb2O5—5TiO2—4SiO2 | 0.28 | 67.1 | 18.8 | 31.0 | 630 | 6.5 | 1.3 | ⊚ |
| Example 26 | (Co—21Pt4Ru)—1.5Nb2O5—5TiO2—4SiO2 | 0.28 | 67.1 | 18.8 | 31.0 | 640 | 6 | 1.2 | ⊚ |
| Comp. 1 | (Co—5Pt)—7TiO2—5.5SiO2 | 0.05 | 83.1 | 4.4 | 31.2 | 795 | 1.5 | 3 | X |
| Comp. 2 | (Co—10Pt)—7TiO2—5.5SiO2 | 0.11 | 78.8 | 8.8 | 31.2 | 770 | 3.7 | 2.9 | X |
| Comp. 3 | (Co—14Pt)—7TiO2—5.5SiO2 | 0.16 | 75.3 | 12.3 | 31.2 | 730 | 6.8 | 2.7 | X |
| Comp. 4 | (Co—16Pt)—7TiO2—5.5SiO2 | 0.19 | 73.5 | 14.0 | 31.2 | 720 | 6.9 | 2.6 | X |
| Comp. 5 | (Co—18Pt)—7TiO2—5.5SiO2 | 0.22 | 71.8 | 15.8 | 31.2 | 716 | 7.1 | 2.5 | X |
| Comp. 6 | (Co—21Pt)—7TiO2—5.5SiO2 | 0.27 | 69.1 | 18.4 | 31.2 | 700 | 7.3 | 2.4 | X |
| Comp. 7 | (Co—23Pt)—7TiO2—5.5SiO2 | 0.30 | 67.4 | 20.1 | 31.2 | 685 | 7.4 | 2.3 | X |
| Comp. 8 | (Co—25Pt)—7TiO2—5.5SiO2 | 0.33 | 65.6 | 21.9 | 31.2 | 660 | 7.45 | 2.5 | X |
| Comp. 9 | (Co—26Pt)—7TiO2—5.5SiO2 | 0.35 | 64.8 | 22.8 | 31.2 | 651 | 7.35 | 2.4 | X |

TABLE 1-continued

|  | Target Composition | Pt/Co Ratio | Co Contained Molar Ratio | Pt Contained Molar Ratio | Oxide Volume Fraction | Ms | Ku | α | Effect |
|---|---|---|---|---|---|---|---|---|---|
| Comp. 10 | (Co—28Pt)—7TiO2—5.5SiO2 | 0.39 | 63.0 | 24.5 | 31.2 | 636 | 7.2 | 2.3 | X |
| Comp. 11 | (Co—30Pt)—7TiO2—5.5SiO2 | 0.43 | 61.3 | 26.3 | 31.2 | 605 | 6.9 | 2.4 | X |
| Comp. 12 | (Co—31Pt)—7TiO2—5.5SiO2 | 0.45 | 60.4 | 27.1 | 31.2 | 590 | 6.7 | 2.3 | X |
| Comp. 13 | (Co—21Pt—4Cr—4Ru)—7TiO2—5.5SiO2 | 0.30 | 62.1 | 18.4 | 31.2 | 576 | 5 | 2 | X |
| Comp. 14 | (Co—21Pt—4Cr)—7TiO2—5.5SiO2 | 0.28 | 65.6 | 18.4 | 31.2 | 628 | 6.1 | 2.2 | X |
| Comp. 15 | (Co—21Pt—4Ru)—7TiO2—5.5SiO2 | 0.28 | 65.6 | 18.4 | 31.2 | 635 | 5.7 | 2.1 | X |

From the results shown in Table 1, it is found that in Inventive Examples 1 to 26 containing $Nb_2O_5$, the slope α of the magnetization curve is effectively reduced while maintaining the relatively high saturation magnetization Ms and magnetic anisotropy Ku. However, in Comparative Examples 1 to 15 which did not contain $Nb_2O_5$, the slope α of the magnetization curve was not reduced.

Further, each of Inventive Examples 1 to 12 and Comparative Examples 1 to 12 in Table 1 was confirmed for each change of the saturation magnetization Ms, the magnetic anisotropy Ku and the slope α of the magnetization curve relative to the ratio Pt/Co. The results are shown in graphs in FIGS. 2 to 4, respectively.

For reference, two graphs (which correspond to Invention Examples 19 and 18, respectively) of SEM/EDS mapping images of the targets and the identification results of the crystal structures of the targets using XRD are shown in FIGS. 5 and 6.

In view of the foregoing, it was suggested that according to the present invention, the magnetic separation between the magnetic particles can be improved without greatly decreasing the magnetic anisotropy in the magnetic layer of the magnetic recording medium.

What is claimed is:

1. A sputtering target containing Co and Pt as metal components, wherein a molar ratio of a content of Pt to a content of Co is from 5/100 to 45/100, wherein the sputtering target contains Ti, Nb, and O, wherein the sputtering target has a phase including all of Ti, Nb, and O, and wherein the phase has a complex oxide phase and/or a solid solution phase, wherein the complex oxide phase has a metal oxide component including Ti and Nb, wherein the solid solution phase has Nb oxide mixed with Ti and/or Ti oxide mixed with Nb, and wherein the sputtering target is free from Cr.

2. The sputtering target according to claim 1, wherein the sputtering target comprises a structure having a metal phase including Co and Pt and an oxide particle.

3. The sputtering target according to claim 1, wherein the sputtering target contains further $Nb_2O_5$ of from 0.5 mol % to 5 mol %.

4. The sputtering target according to claim 1, wherein the sputtering target contains $TiO_2$ as a metal oxide component and has a content of $TiO_2$ of from 0.5 mol % to 15 mol %.

5. The sputtering target according to claim 1, wherein the sputtering target further contains at least one metal oxide of $SiO_2$ and $B_2O_3$ as a metal oxide component, and wherein the sputtering target has a total content of metal oxides including $Nb_2O_5$ of from 20 vol % to 40 vol %.

6. The sputtering target according to claim 1, wherein the sputtering target has a molar ratio of a content of Pt to a content of Co of from 15/100 to 35/100.

7. The sputtering target according to claim 1, wherein the sputtering target contains Pt in an amount of from 2 mol % to 25 mol %.

8. The sputtering target according to claim 1, wherein the sputtering target further contains Ru as a metal component in an amount of from 0.5 mol % to 20 mol %.

* * * * *